United States Patent [19]
Pritchard

[11] Patent Number: 5,848,165
[45] Date of Patent: Dec. 8, 1998

[54] FAT SOUND CREATION MEANS

[76] Inventor: Eric K. Pritchard, Rte. 1, Box 536, Berkeley Springs, W. Va. 25411

[21] Appl. No.: 758,855

[22] Filed: Dec. 2, 1996

Related U.S. Application Data

[63] Continuation-in-part of Ser. No. 394,303, Feb. 24, 1995, and a continuation-in-part of Ser. No. 281,019, Jul. 27, 1994.

[51] Int. Cl.$^6$ ....................................................... H03G 3/00
[52] U.S. Cl. ................................. 381/61; 84/694; 84/624
[58] Field of Search .......................... 381/61, 98; 84/624, 84/694; 330/262, 264

[56] References Cited

U.S. PATENT DOCUMENTS

| | | |
|---|---|---|
| 1,830,402 | 11/1931 | Miessner . |
| 1,977,469 | 10/1934 | Bussard . |
| 2,727,949 | 12/1955 | Lokkesmoe . |
| 3,532,799 | 10/1970 | Kameoka et al. . |
| 3,598,891 | 8/1971 | Adachi . |
| 3,789,143 | 1/1974 | Blackmer . |
| 4,096,438 | 6/1978 | Humphrey . |
| 4,150,253 | 4/1979 | Knoppel . |
| 4,180,707 | 12/1979 | Moog . |
| 4,586,192 | 4/1986 | Arnston . |
| 4,627,094 | 12/1986 | Scholz . |
| 4,731,852 | 3/1988 | Liljeryd . |
| 5,091,700 | 2/1992 | Smith . |
| 5,173,178 | 12/1992 | Kawashima et al. . |
| 5,243,660 | 9/1993 | Zagorski . |
| 5,487,114 | 1/1996 | Dinh . |

OTHER PUBLICATIONS

National Semiconductor, LM380 (pp. 10–41, 10–42, 10–43), 1976.
Spice for Circuits and Electronics Using PSpice, M. Rashid, 1990, pp. 1–4.
Loudspeakers, Part III by David Funk, Vintage Guitar, Jul. 1996, p. 161.
Gretsch Electromatic 'Artist' Amplifier, by Jim Hilmar, Vintage Guitar Classics, Mar., 1996, p. 54.
Radiotron Designer's Handbook, 4th Edition, 1953, p. 838.
Radiotron Designer's Handbook, edited by F. Langford-Smith, 1953, p. 840.
Radiotron Designer's Handbook, pp. 1322–1323, edited by F. Langford–Smith, 1953, RCA Victor Division, Radio Corporation of America.
Electronic Circuits, Prentice–Hall, pp. 84–87.

*Primary Examiner*—Forester W. Isen
*Attorney, Agent, or Firm*—Barnes & Thornburg

[57] ABSTRACT

Intermodulation means for the emulation and exaggeration of an aspect of vacuum tube amplifiers by solid state, digital, speaker or other means. The intermodulation means produces intermodulation products of the input and an audio signal source which may be a spectrum-limited, filtered version of the input or the output or a spectrum-limited repetitive or random noise generator.

56 Claims, 6 Drawing Sheets

FAT SOUND CREATION MEANS

BACKGROUND AND SUMMARY OF THE INVENTION

CROSS REFERENCE

This is a continuation-in-part of U.S. application Ser. No. 08/394,303 filed Feb. 24, 1995 and is a continuation-in-part of U.S. application Ser. No. 08/281,019 filed Jul. 27, 1994.

DESCRIPTION

The present invention relates to the emulation of tube amplifiers, more particularly to the emulation of the fat created by intermodulation distortion, and extends the fundamental mathematics to the structure of speakers and computer programming for audio.

Although it has not been realized, the prior art is the power stage of the vacuum tube amplifier. There is an intermodulation of the power supply ripple with the input signal created by any or all of the comparatively low output resistance of vacuum tubes or the reaction to the ripple on the bias supplies by the screen or control grids. The engineering community has not found this character desirable because it violates their basic paradigm that amplifiers must replicate their inputs without embellishments. However, the more artistic appreciate these embellishments although they do not know their source.

Also similar, but inadequate, art is the tremolo circuit used by many older guitar amplifiers. However, the spectrum of the tremolo signal is too low to be noticed as a note because it is slow enough to create perceptible level changes. The −3 db point of the tremolo signal spectrum is far below 50 Hertz.

More distantly related art is the audio compressor, for example Scholz, U.S. Pat. No. 4,627,094. It measures the input or output signals and changes its gain to produce a less dynamic output signal. The measurement of the input or output signals uses a rectification means and low-pass filtering characterized by a D.C. component that is responsive to the input signal. Since the compressor is not supposed to produce harmonics, intermodulation produces, or other embellishments when the input is constant, said filter signal is further characterized by having no audible signal for a constant input.

Additionally, Knopple, U.S. Pat. No. 4,150,253, distorts the output of a high-pass filter and adds the result with the original signal. And Liljeryd, U.S. Pat. No. 4,731,852, uses a constant 90 degree phase shifter and multiplier to produce only the sum frequency intermodulation products.

The speaker structure art has multiple winding speakers. Both Miessner, U.S. Pat. No. 1,830,402, and Bussard, U.S. Pat. No. 1,9777,469, depend upon the power supplies of vacuum tubes to power the field coil. These speakers became obsolete about 45 years ago with the production of the permanent magnet speaker. This speaker is so cost ineffective that amplifier systems used the permanent magnet speaker in spite of having to provide the power supply with a filter choke. Consequently, the only reason for using this type of speaker is for its heretofore unknown special character.

Another speaker without a permanent magnet is Dinh, U.S. Pat. No. 5,487,114, which operates with a field coil that is connected to the input via a bridge rectifier. The consequential D.C. current in the field of Dinh is dependent upon the input and is filtered by the inductance of the field coil. Unfortunately, it does not work at low levels and requires extra power. The extra power requirement would probably adversely affect the tone of a guitar amplifier.

A high-fidelity speaker was disclosed by Lokkesmoe in U.S. Pat. No. 2,727,949 that included a permanent magnet as well as a field coil. The field coil and its parallel connected 25–30 Hertz band-pass filter extended the frequency response of the speaker. The extension of the frequency response by the field coil would require a significant power. This is consistent with a further analysis of the Lokkesmoe speaker. The series connected capacitor 22 is chosen to resonate the field coil and other connected inductors at 25–30 Hertz or about 175 radians per second. Since it is resonant, it probably has a Q of about 1. This forces the R/L frequency to be 175. A speaker of that era was modeled in *Radiotron Designer's Handbook,* 4th edition, 1953, page 838, with a voice coil inductance of 2.4 millihenries and D.C. resistance of 10.4 ohms. Since the Lokkesmoe design uses a field coil "preferably of higher" inductance than the voice coil, the field coil might be 10 millihenries. This implies a field coil and other connected inductors have a total D.C. resistance of 1.75 ohms. Thus, the field coil will draw more power than the voice coil. Although, one might believe the field coil inductance might reduce its power drain at higher frequencies, the magnetic losses at higher frequencies probably keep the power requirements up.

Moog, U.S. Pat. No. 4,180,707, has a multiplicative means driven by an input and a high-pass filter that does not restrict the upper audio spectrum.

*Radiotron Designer's Handbook,* pp 1322–1323, edited by F. Langford-Smith, 1953, RCA Victor Division, Radio Corporation of America, the only reference to mention intermodulation, describes hum distortion as the intermodulation of the power supply frequencies with the input signal at high volumes due to undersized power supply capacitors. This reference indicates that hum distortion is often overlooked when dealing with individual sources of distortion and, in fact, hum distortion was not included in the distortion section of this handbook. Also, hum distortion was not regarded as desirable.

The control grid bias supply of a vacuum tube amplifier is a potential source of an intermodulation signal source. However, it has not been a source because it has always been too easy to follow the engineering ideal of having essentially no ripple. Further, most amplifiers only use a half-wave rectification which has not been identified with goals of the present invention.

OBJECT OF THE INVENTION

The object of this invention is the intermodulation embellishment of an audio input signal with low-frequency, upper spectrum limited audio signal which does not include rectification and filtering of the input or the output and which is not the power supply of a tube amplifier. Further objects of this invention are the specific application of this concept to speakers, speaker emulators, and amplifiers.

DETAILED DESCRIPTION OF THE FIGURES

Figure 1:
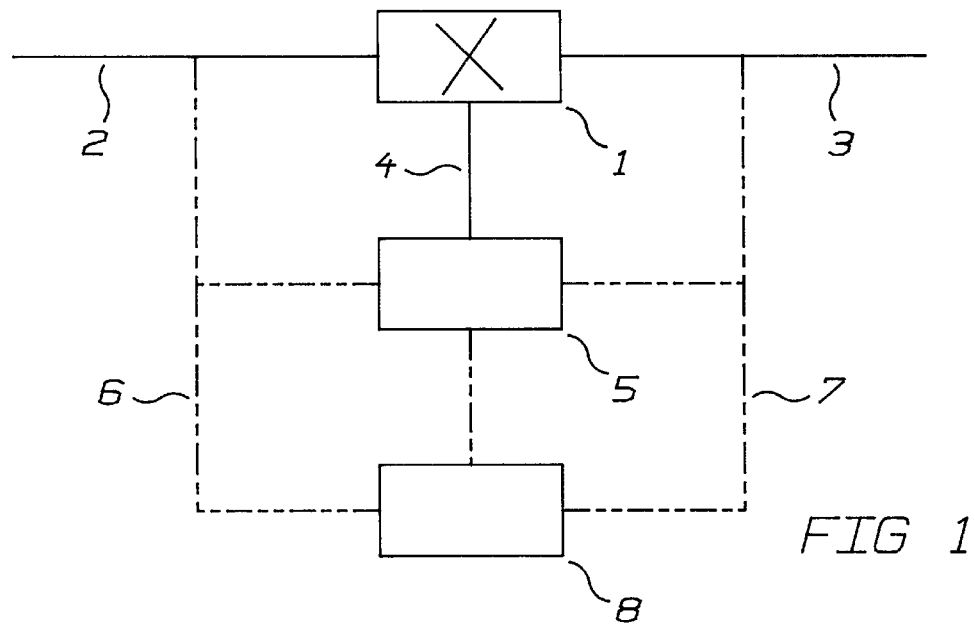
FIG. 1 is the block diagram of the theory.

FIG. 1 shows a non-linear means 1, such as a multiplying means, receiving an input on signal path 2 and producing an output 3. The non-linear means has a second input 4 which is created by a low-frequency means 5. The low-frequency means produces a signal composed of an audible low-frequency audio signal with a fundamental generally below 1000 Hertz or a spectrum which is more limited in the high frequencies than the input spectrum on signal path 2. Additionally, the spectrum below 50 Hertz has little use in guitar speakers. This low frequency signal may be created by a signal source independent of the input, such as a generator or a power supply, or may be created by a low-frequency audio filter which is dependent upon either the input or the output, as shown by signal paths 6 and 7. This filter, to keep the spectrum limited to low-frequencies relative to the spectrum of the input, is a low-pass or band-pass with a resonant frequency or roll-off frequency above 50 Hertz and below 1000 Hertz or a fraction of the input spectrum.

The non-linear means creates intermodulation products of the signals on paths 2 and 4. The signal on path 2 and the D.C. component of the signal on path 4 combine to replicate the input signal on the output. The signal on path 2 and the audio component of the signal on path 4 combine to embellish the output intermodulation products of the two signals. In the case of the low-frequency source being dependent upon the input or the output, those intermodulation products can include harmonics of the input signal. The non-linear means creates intermodulation products whether or not the non-linear means is clipping.

The low-frequency means 5 may also be a controlled generator such as a voltage controlled oscillator. This provides an opportunity to match the spectrum of the generator with the spectrum of the input or output, generally keeping the spectrum of the generator a fraction of the input. This is accomplished by providing a control input which is frequency dependent. The signal on signal path 6 or 7 is filtered with a high-pass filter and then rectified to provide said control signal, see FIG. 5.

Although there are many broad spectrum oscillators, the preferred oscillator has a waveform between a triangle and a sawtooth. The triangle wave form has every odd harmonic with amplitudes that roll off at 12 db per octave like a two pole filter. The sawtooth wave form has every harmonic and the amplitudes roll off at 6 db per octave, quite similar to a single pole low-pass filter or a low-Q band-pass filter. In either case the spectrum of a low-frequency means is limited and in contrast to a high-pass filter which has an unlimited spectrum above the frequencies of interest.

Empirically the oscillator should produce frequencies in the 100 to 300 Hertz range.

The low-frequency means 5 may be a band-limited random noise generator. The use of a random noise generator provides a generally unrecognizable signal instead of the well-known power supply hum or the readily identified oscillator signal. Although these signals are not heard at low levels, they can be heard at high levels. The random noise generator still fattens the notes but does not produce an extra recognizable signal.

This concept is advanced by moving the band-limited random noise generator to 8 and placing a variable bandwidth filter between in 5. The variable bandwidth filter has a bandwidth dependent upon the frequency/amplitude of either the input or the output signals on paths 6 or 7, see FIG. 6.

Additionally, FIG. 1 shows yet another alternative path for dependency upon the input or output via the compressor 8. Since these effects are quite level dependent, the compressor serves to reduce the level dependency and spread the embellishment effect over a broader range of inputs. The compressor makes the controlled generator embodiment less level dependent.

Unlike the compressor, the signal path 4 has an audible signal even when the signal at the input is constant.

The signal injection, via path 4, needs to be subtle for, in this case, too much is not a good thing, yet contrary to accepted thought, none is not as good either. The use of the input or the output via paths 6 or 7 produces second harmonics which should be limited below 10 percent. The use of an oscillator should be more limited, to about 2 percent.

Figure 2:
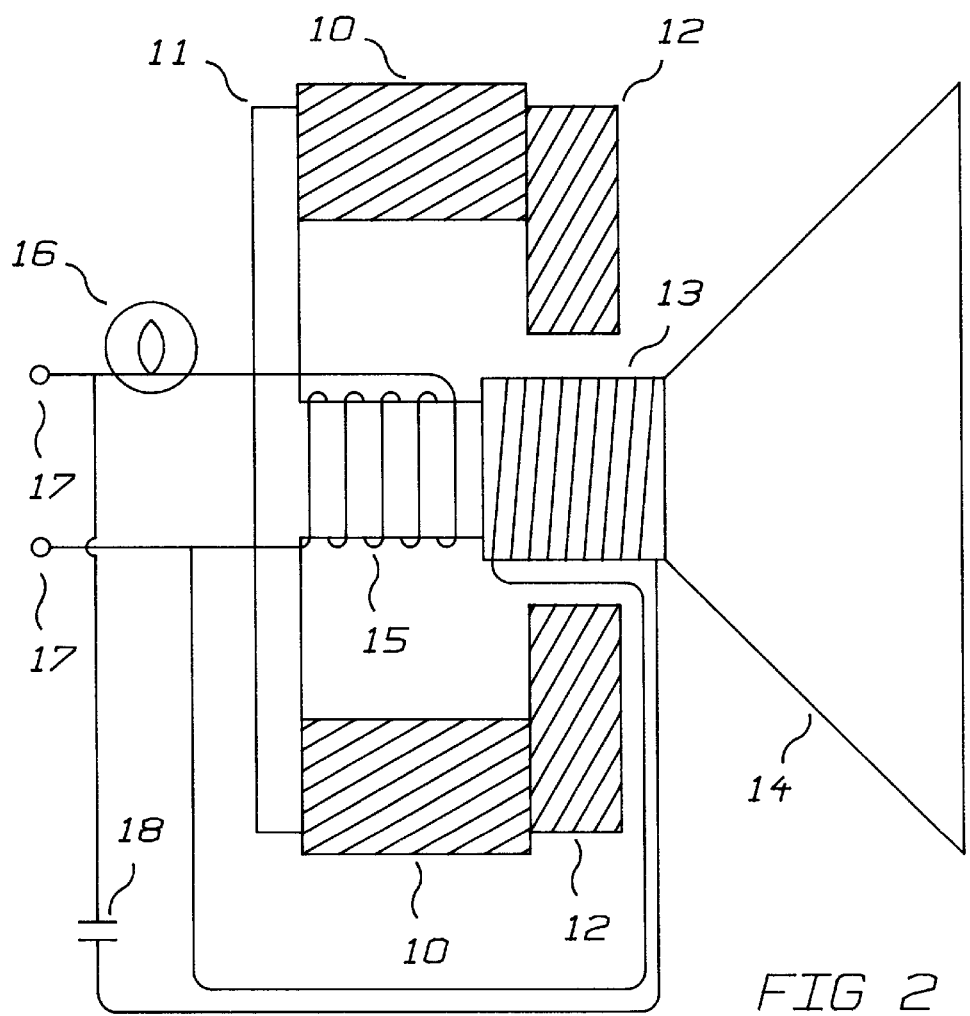
FIG. 2 is the speaker embodiment.
Figure 3:
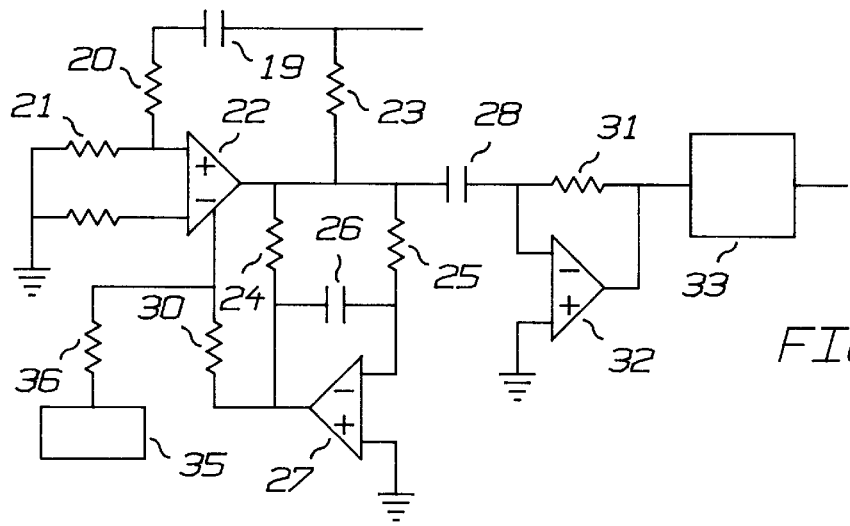
FIG. 3 is a schematic diagram of a speaker emulator embodiment.

As shown in FIGS. 2 and 3, the non-linear means input which is connected to the input can include a series capacitor, such as 18 or 19, or other filter means to reduce the bass frequencies going through the non-linear means and consequentially the production of harmonics of those bass frequencies.

THE SPEAKER EMBODIMENT

FIG. 2 is the speaker embodiment showing a permanent magnet 10 which produces a magnetic field that is conducted by an inner pole piece 11 and an outer pole piece 12 to the magnetic gap created for the voice coil 13. The voice coil drives the speaker cone 14. For clarity the remaining standard speaker components, frame and cone suspension, are not shown but are required.

The improvement to this speaker is the additional coil or the field coil 15 which is preferably wound on the inner pole piece 11. This coil can be wound to have a significant inductance and resistance and thereby forms a low-frequency low-pass filter which may be augmented external components as well-known to the filter arts. Like the voice coil, this field coil is responsive to the input. It may be directly connected to the speaker terminals 17 or connected via a lamp 16. Additional filtering may be added to either connection. The resistance characteristic of a properly sized lamp produces little attenuation at low input signal levels, but a substantial attenuation at high input signal levels to extend the range of the embellishment.

The embellishment is formed by the interaction of the signal in the voice coil with the signal in the field winding.

While the usually expected output is formed by the non-linear, approximately multiplicative, interaction of the signal and the permanent magnet, the embellishments are formed by the same non-linear, approximately multiplicative, interaction of the signal in the voice coil with the filtered signal in the field winding. The field coil can produce a signal in the output by inducing a current into the voice coil. However, this is not efficient and is comparatively less than driving the voice coil directly.

The speaker permanent magnet produces most of the magnetic field, substantially more field than the field winding. This magnetic field biases the field coil to produce a net field at the voice coil.

Unlike the prior art, Lokkesmoe U.S. Pat. No. 2,727,949, the field coil is intended to produce a moderate amount of intermodulation distortion. The power required to produce an intermodulation distortion which enhances the sound instead of detracting from the sound is substantially lower than the apparent power requirements for extending the frequency response. Consequentially, the Lokkesmoe described coupling between the field coil and the voice coil does not produce any extension in the frequency response. Thus, the field coil of the present speaker invention falls into the pattern of this disclosure of producing intermodulation without adding significantly to the output.

The power requirements of the present invention field coil are substantially lower since the field coil of the present invention has a D.C. resistance higher than the voice coil. Although high fidelity speakers may have low efficiencies, low efficiency is not universally acceptable and particularly not acceptable for guitar speakers. Such a high resistance precludes series resonance at very low frequencies as found in the prior art.

For clarity, FIG. 2 is not to scale. In reality, the magnet 10 is substantially thinner than shown and consequently minimizes the length of the field coil 15. Also, the ceramic magnet used today are thinner and the magnetic circuit is much shorter than the Alnico magnets used in the past because the ceramic magnet has a much higher coercive force. This makes the space available for the field coil much smaller. Further, as shown, the voice coil moves over the field coil and constrains its outer diameter. The inner diameter is also constrained by the desire to keep the reluctance of the magnetic field path low. Thus, the substantial field coil required by Lokkesmoe is not practical now.

The interaction of the voice coil with the permanent magnet produces the input signal. The interaction of the voice coil and the field coil produces intermodulation products. The field coil via other means produces comparatively less of the signal than the voice coil and the permanent magnet.

The upper minus 3 db roll-off point of the Lokkesmoe band-pass filtering for a resonant frequency of 30 Hertz and assuming a Q of 1 is about 48 Hertz, generally too low for successful operation according to the precepts of the present invention.

The speaker embodiment can also use a broad-spectrum, low-frequency oscillator to drive the field coil, however the transformer coupling from the field coil to the voice coil coupled with the finite impedance of the driving amplifier allows the oscillator to be heard, however, a third winding, co-located with the voice coil and field coil, such as found in Miessner serves to cancel oscillator signal, but not the intermodulation products. However, the Miessner speaker has been obsolete for about 45 years. It is more expensive to build and to use than the standard permanent magnet speaker.

The fat concept is also applicable to higher frequency speakers, such as tweeters. In this case capacitor 18 or other filter means is used to remove the bass frequencies in the voice coil. Thus, the harmonics of the low-frequencies passed to the field coil are eliminated, but the intermodulation distortion enhancements remain.

THE SPEAKER EMULATOR EMBODIMENT

FIG. 3 is the speaker emulator embodiment that also shows the fundamentals of FIG. 1. The input is received and attenuated by resistors 20 and 21 to drive a transconductance operational amplifier 22. Optional capacitor 19 also attenuates bass frequencies. The output current of this amplifier plus the additional current including bass frequencies from the input via resistor 23 drives a low-frequency filter created by components 24–28. The frequency of this filter is nominally the resonant of the frequency of the speaker being emulated. The combination of resistors 24 and 25, capacitor 26, and operational amplifier 27 appears to capacitor 28 to be a parallel combination of a resistor equivalent to the parallel combination of resistors 23–25 and an inductor equivalent to the product of the resistors 24 and 25 and capacitor 26. These equivalent components combine with capacitor 28 to create a resonant circuit. The output of operational amplifier 27 is then an underdamped low-pass filter which drives the bias input of the transconductance amplifier 22 via resistor 30. Since the bias input of the preferred transconductance amplifier, either a Harris CA3080 or National LM3080, is referred to the negative power supply while the operational amplifier 27 output is referred to ground, the bias current, according the present invention, consists of a D.C. component independent of the input and a low-frequency component. This component is used by the non-linear, approximately multiplicative, character of the operational transconductance amplifier 22 to operate upon the input signal.

The use of resistor 23 is used to lower the noise in the output of this circuit. However, it also shows an equivalency that is important to this disclosure. The net signal that drives the components 24–28 has an input component which is formed from the D.C. bias via resistor 30 and plus the input signal via resistor 23. In fact, if the transconductance amplifier 22 were a four-quadrant multiplier, instead of an approximate two-quadrant multiplier, the bias in resistor 30 could be completely replaced by the signal in resistor 23.

The current in capacitor 28 is amplified by the combination of the resistor 31 and operational amplifier 32. This amplifier produces an under damped high-pass output as the speaker does. The treble roll-off of the speaker is simulated by a low-pass filter 33.

The character of the speaker emulator can be further enhanced with a broad spectrum, low-frequency oscillator or random waveform generator 35, such as a saw-tooth, which drives the transconductance amplifier 22 via resistor 36.

THE AMPLIFIER EMBODIMENT

Figure 4:
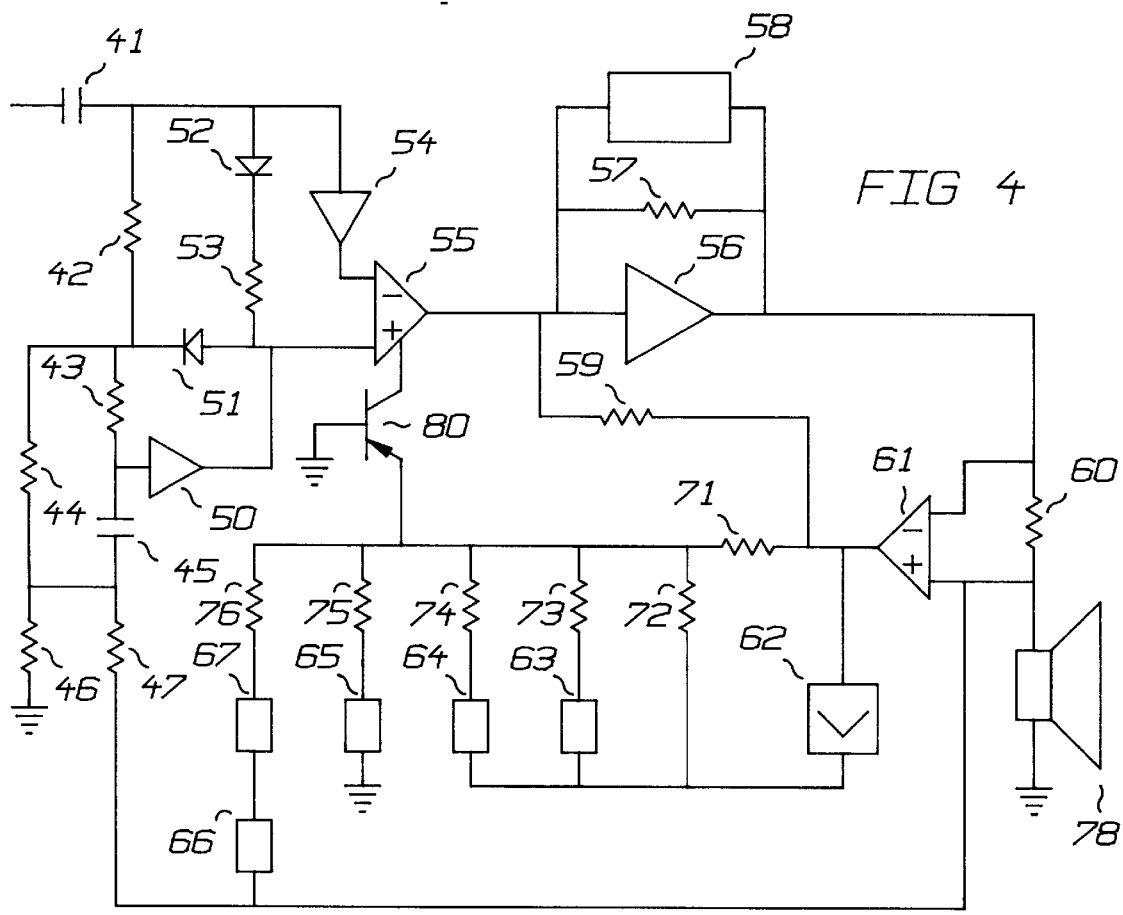
FIG. 4 is a schematic diagram of a first amplifier embodiment.

FIG. 4 is an amplifier embodiment. The behavior of a standard tube amplifier consisting of a differential amplifier acting as a phase splitter, a pair of push-pull output tubes that drive the output via a transformer, feedback, and a power supply having main, screen, and control grid outputs is emulated by this circuit. The basic input circuit is simply copied with input coupling capacitor 41 and grid bias resistors 42 and 43. The resistor 44 corresponds to the cathode resistor of said differential phase splitter. The feedback is applied through capacitor 45 and voltage divider resistors 46 and 47. Amplifier 50 is a unity gain connected operational amplifier. Diode 51 keeps the common cathode junction between resistors 42 and 43 from going too low. This condition occurs when the tube differential phase splitter is cutoff. Diode 52 emulates the grid conduction. Resistor 53 emulates the effective grid impedance. It may be estimated as the gain of tube phase splitter times its cathode resistance. It is adjusted to provide the desired overdrive bias shifting and resulting harmonic generation. Unity gain buffers 50 and 54 prepare the resulting signal for the generally lower impedance transconductance amplifier 55, again a Harris CA3080 or National LM3080 for example. The transconductance amplifier 55 drives inverting power amplifier 56 with a bipolar current. This amplifier has a non-linear feedback 58 to emulate the curvature of the plate resistance character. The output current, the speaker 78 current, is measured by resistor 60 and differential amplifier 61. This amplifier supplies a signal indicative of the output load current to the transconductance amplifier biasing components 62–67 and 71–76. Resistor 59 provides current feedback to amplifier 56 to give amplifier 56 a high output impedance.

Unlike the previous embodiment, the bias of the transconductance amplifier is referred to a voltage near ground by transistor 80. The primary source of the bias current and the improvement of the present invention is the current flowing in resistor 75 from the bias supply 65. The bias supply is a typical line-operated unregulated power supply. However, like the tube amplifier grid bias supply, this supply is preferably separate.

Further, in the case that the amplifier incorporated switching supplies or was battery operated, the bias supply 65 could be replaced by an alternative broad spectrum, low-frequency source, for example, a 50 to 200 Hertz saw-tooth oscillator or a band-limited random noise generator. Note that either means is applicable to any amplifier, including a vacuum tube amplifier, that does not have the proper ripple.

The absolute value circuit 62 emulates the power supply current to the push-pull output tubes of the emulated tube amplifier.

The filter 63 emulates the response of the power supply and produces a negative going output for an increasing magnitude of output current. The character of this filter may be a resonant frequency of about 8 hertz with a Q of about 2 or a low-pass filter with a time constant of approximately 100 milliseconds.

The filter 64 emulates the power tube self bias and also produces a negative going output for an increasing magnitude of output current. The character of this filter is single pole with a time constant of approximately 5 milliseconds.

The remaining path consists of another improvement of the present invention. The compressor 66 which preferably uses a series lamp, drives a low-pass filter 67. Resistor 76 passes the resulting signal to the bias input of amplifier 55.

The resistors 71 through 76 carry bias currents from the components 61 through 67 to the bias input of transconductance amplifier 55. The total bias sets the transconductance and the maximum magnitude of the output current of said transconductance amplifier. The current through resistor 71 creates even harmonics in the output because the gain is a function of the signal. The current through resistor 72 changes the gain of transconductance amplifier with the magnitude of the signal and creates odd harmonics in the output. This resistor needs to be sized to produce harmonic levels less than 1 percent at low levels and levels greater than one percent at high, but unclipped, levels. The current through resistor 73 creates the screen grid compression effect because the gain is a function of the emulated power supply response. The current through resistor 74 creates the cathode bias effects because the gain is a function of the emulated cathode bias.

Since the total current flow through resistors 71 through 76 determines the maximum current that can flow out of the transconductance amplifier 55 and drive the following amplifier 56, these must be picked with so that low impedance loads do not saturate amplifier 56 and higher impedance loads do saturate amplifier 56. This gives the amplifier its two clipping regions and a portion of the vintage tone.

Further, resistor 72 must be sized to produce the substantial third harmonic found in push-pull amplifiers. This is sized to produce a blending of non-clipped and clipped distortion so that the amplifier distorts over a wide range of inputs. This is the opposite of the usual engineering philosophy of pushing the distortion region up to the clipping point and then paying the price of instant and harsh audible complaints.

Obviously, filter 64 and resistor 74 may be omitted if cathode or self bias effects are not wanted. However, they do produce a pleasant chime effect. Also additional filters can be added to include, for example, the output tube bias signal effects.

The absolute value circuit 62 need not be precision. The requisite diodes may exhibit their voltage drops since the effects that this circuit drives and creates occur at large signal levels. This creates an essentially linear region which then becomes non-linear as the signals approach clipping and produces the other two regions of amplifier operation.

THE SPEAKER

Figure 12:
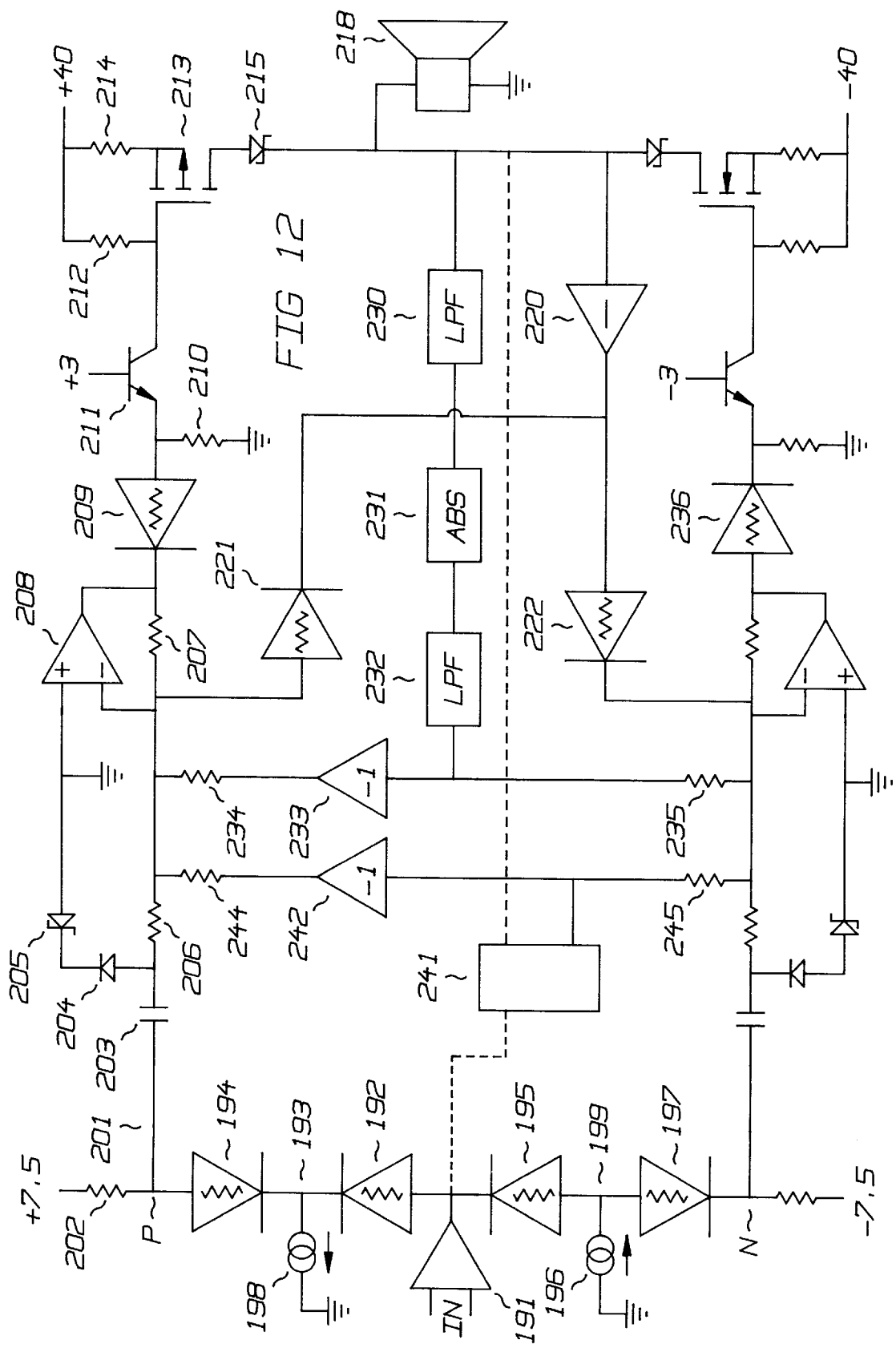
FIG. 12 is a schematic diagram of a second amplifier embodiment.
Figure 13:
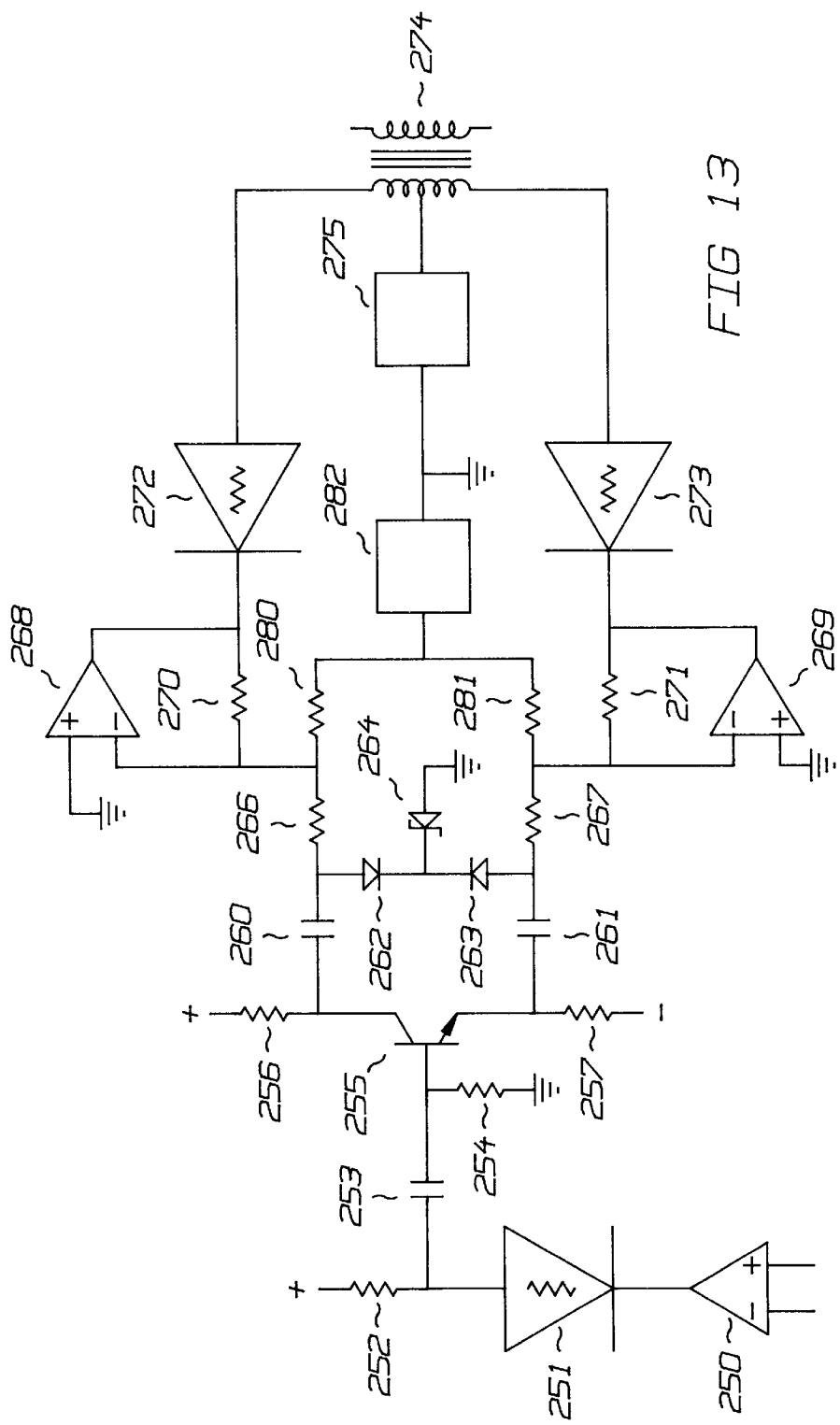
FIG. 13 is a schematic diagram of a third amplifier, variable resistance embodiment.

The speaker 78 of FIG. 4 and 218 of FIG. 12 plus the speaker load for FIG. 13 are preferably the fat enhanced speaker of FIG. 2 which provides the desired intermodulation distortion enhancement whether the amplifier is clipping or not. Although the teachings herein suggest the use of one of the prior art speakers, such as Bussard, Lokkesmoe, or Miessner, they are not good choices and would otherwise not be used. These speakers are not in production and have not been for about 45 years, they require components that are not commonly produced, they cost more than standard speakers, and they cost more to use. Bussard and Miessner require power supply connections and larger power supplies. Bussard uses the amplifier to cancel the unwanted hum, but unfortunately, the amplifier will fail to cancel the hum when it is clipping. The Lokkesmoe speaker require substantial extra power to produce a wider bandwidth which is not needed any more. The Miessner speaker requires a third coil and the adjustment thereof to null the field coil hum.

THE POWER SUPPLY

Figure 5:
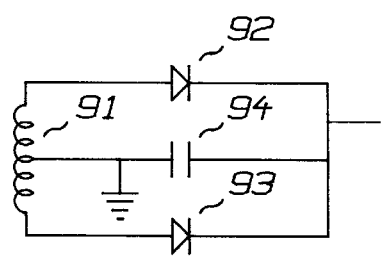
FIG. 5 is a schematic diagram of a power supply embodiment.

FIG. 5 is the schematic of a power supply for use in elements 35, 65, or 241 showing a center-tapped power transformer winding 91 driving two diodes 92 and 93 and filter capacitor 94 in the standard full-wave center-tapped circuit. The capacitor is sized to provide the desired embellishment, about 1 to 5 percent ripple.

THE CONTROLLED GENERATOR IMPROVEMENT

Figure 6:
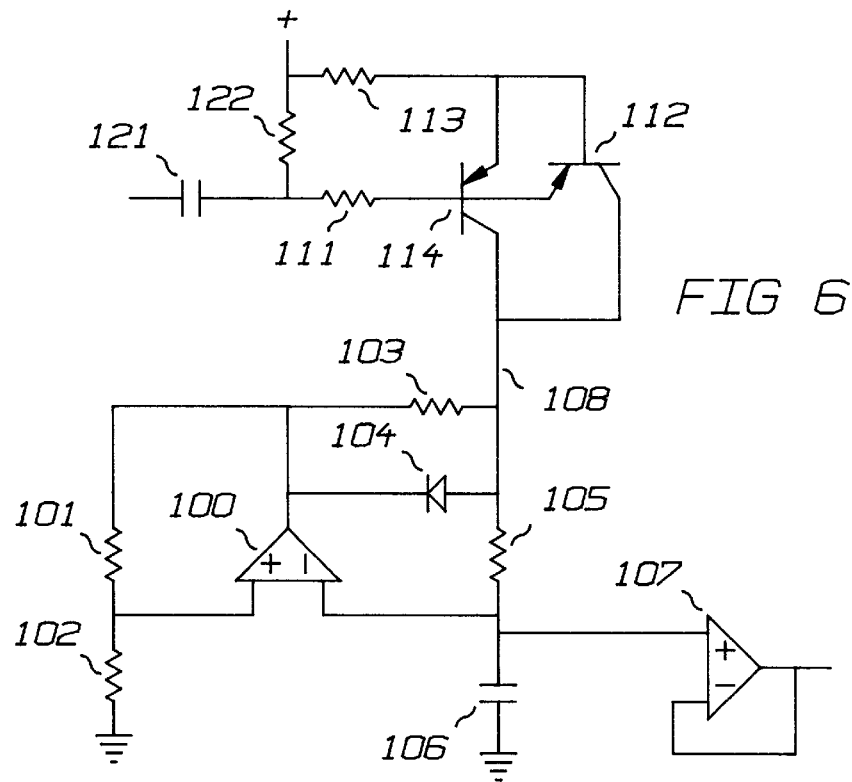
FIG. 6 is a schematic diagram of a controlled generator embodiment.

FIGS. 3, 4, and 12 may include a generator means, 35, 65 and 241 respectively. FIG. 6 provides an example of a generator means which may also be controlled via an input.

The generator means is preferably one of the many sawtooth oscillators known in the arts. The one illustrated in FIG. 6 uses an operational amplifier 100 with both positive and negative feedback. Resistors 101 and 102 provides positive feedback and sets the voltage extremes for the saw-tooth waveform via the positive and negative saturation voltages of amplifier 100 and the attenuation of resistors 101 and 102. The negative feedback is provided by an asymmetrical RC low-pass filter 103–106. The diode 104 provides a low impedance path shunting the larger resistor 103 when the operational amplifier 100 output is low. This provides a fast discharge path for capacitor 106 via a small resistor 105. When the output of operational amplifier 100 is high, the capacitor 106 charges via resistors 105 and 103.

The output of the saw-tooth oscillator is taken from capacitor 106 either directly or via the buffer connected operational amplifier 107.

The capacitor also provides a control input 108 which is responsive to the rectifier means 111–114. A positive signal on resistor 111 drives transistor 112 in a grounded base configuration while a negative signal on resistor 111 drives the base transistor 114 with a gain limited by resistor 113. Preferably the two resistors 111 and 113 are the same value.

The low-pass filter is formed by series capacitor 121 and shunt resistor 122. This roll-off frequency of this filter should be in the higher end of the spectrum of the input to said capacitor so that the output becomes smaller with lower frequencies.

THE RANDOM NOISE IMPROVEMENTS

Figure 7:
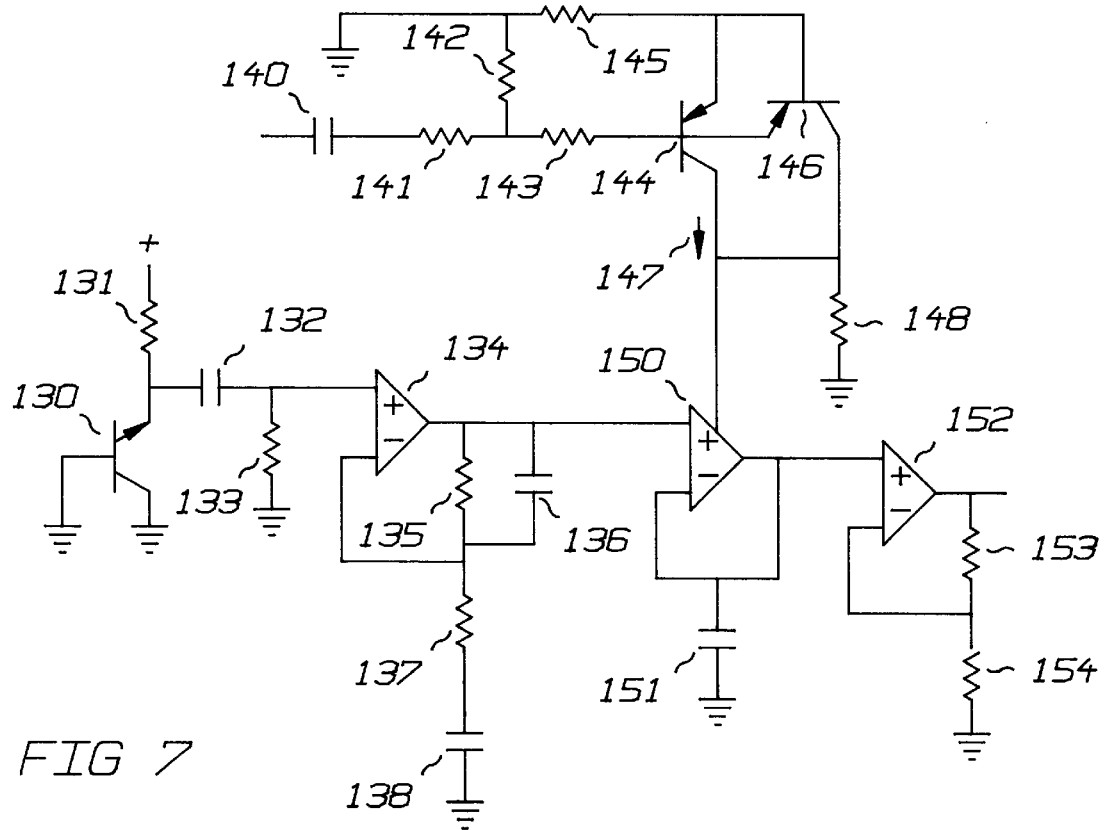
FIG. 7 is a schematic diagram of a controlled bandwidth random noise embodiment.

FIG. 7, another improvement to FIGS. 3, 4 or 12, shows the random noise generator may be created by semiconductor noise or may be created by a pseudo-random noise generator. The pseudo-random noise generator is more consistent and more expensive than semiconductor noise. Resistor 131 is connected to a positive power supply sufficient to reverse bias the base-emitter junction of transistor 130. This will produce noise on the emitter which is amplified by circuit 132–138. The noise is capacitively coupled by capacitor 132 and the operational amplifier 134 is biased by resistor 133. The network 135–138 provides negative feedback and limits the bandwidth of the noise.

The above network could be replaced by the pseudo-random noise generator. Further, either could provide the low-frequency means output on path 4. However for greater effect the following circuit provides said output.

The capacitor 140 accepts the input to the filter control, ie. either path 6 or 7. Resistors 141 and 142 form an optional attenuator while resistor 142 biases the rectification circuit 143–146. As explained above, this circuit produces a current 147 approximately proportional to the absolute value of the input signal. This current and a minimum bias current from resistor 148 controls the bandwidth of the filter 150–151.

The controlled filter 150–151 consists of an operational transconductance amplifier 150 and capacitor 151. This amplifier, preferably a Harris CA3080 or National LM3080, is connected as a unity gain buffer. However, its transconductance is about 20 times the bias current 147. Consequently, over a range of 50 or so millivolts this amplifier appears to be a variable resistor of 0.05 volts divided by the bias current. At 100 microamps, for example, it is about 500 ohms; and at 10 microamps, 5 kilohms. The capacitor, about 1 microfarad, is picked for the desired bandwidth.

Operational amplifier 152 and feedback network 153–154 buffer and amplify the filtered signal to provide the output of the low-frequency means.

NON-LINEAR NETWORK DETAILS

Figure 8:
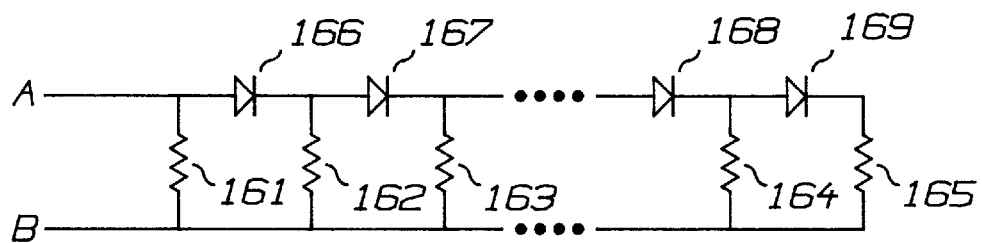
FIG. 8 is a schematic diagram of a parallel resistor-diode non-linear network.

The resistor-diode network of FIG. 8 is described in U.S. Pat. No. 5,133,014. It is a plurality of parallel resistors 161–165 and series diodes 166–169. For input voltages across terminals A and B of less than one diode drop only resistor 161 conducts. For input voltages between one and two diode drops, resistors 161 and 162 conduct. Higher voltages make more resistors conduct, thereby lowering the dynamic resistance of the network.

Figure 9:
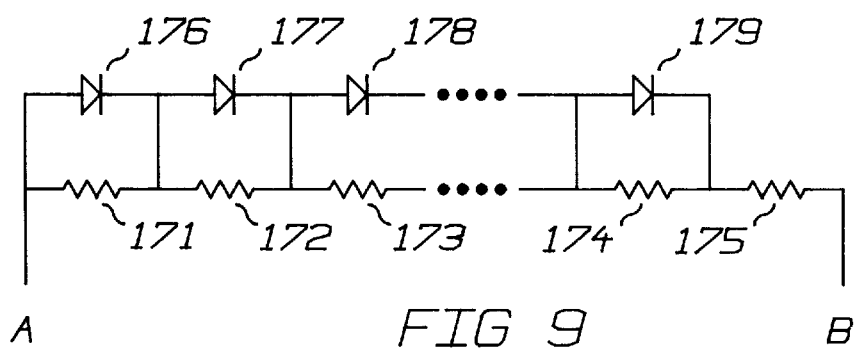
FIG. 9 is a schematic diagram of a series resistor-diode non-linear network.

The resistor-diode network of FIG. 9 has a plurality of parallel resistor and diode pairs in series. As the current flowing from terminal A to B increases, the voltage across the resistors increases. When the resistor voltage approaches the diode drop, the diode conducts and dynamically removes the resistor from the series string. When all of the diodes conduct, the resistance of the network is the resistance of resistor 175.

There is a rough equivalency between these networks: Equal resistors in FIG. 8 produces a current approximately proportional to the square of the voltage across the terminals. Similarly, if the resistors of FIG. 9 are in the ratios of 1, $\frac{1}{2}$, $\frac{1}{6}$, $\frac{1}{10}$, $\frac{1}{15}$... and the last resistor, the nth, is $2/n$, then it too produces a current approximately proportional to the square of the voltage across the terminals A and B.

It should be noted that the networks approximate the desired function over a region. The diodes tend to sectionalize the function and eventually all of the diodes are on and the network becomes linear.

Figure 10:
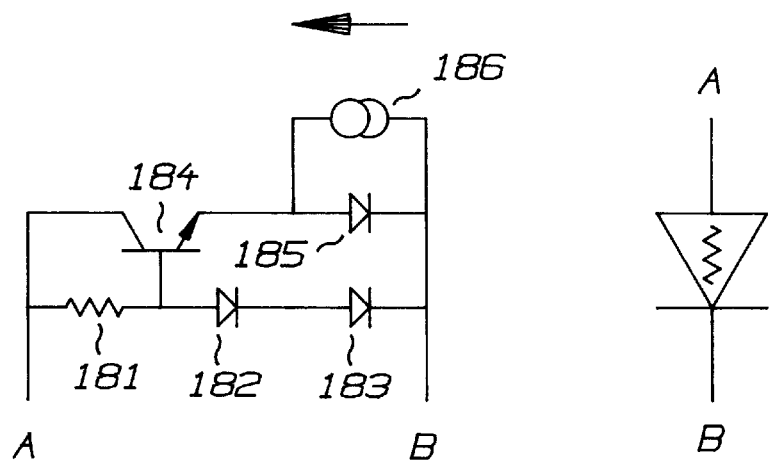
FIG. 10 is a schematic diagram of a diode-transistor non-linear network.

FIG. 10 also produces a squared current using semiconductor behavior found in logarithm amplifiers. The voltage across the terminals A and B is converted to a current by resistor 181. The current produces a voltage on the base of transistor 184 proportional to twice the logarithm of the current by diodes 182 and 183. The transistor 284 converts that voltage to a current in an exponential manner proportional to the square of the voltage across terminals A and B. This is made possible by biasing diode 185 with current source or large capacitor 186.

This non-linear circuit uses an active semiconductor, namely a transistor, to replace many more passive semiconductors, diodes.

Figure 11:
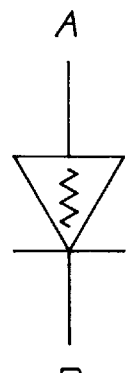
FIG. 11 is a schematic diagram of a symbol for a non-linear network.

For brevity in the drawings, a new symbol shown in FIG. 11 will indicate a non-linear network.

DESCRIPTION OF ANOTHER AMPLIFIER EMBODIMENT

The tube amplifier behavior is provided by the circuit shown in FIG. 12. It shows a complementary "phase splitter" and bipolar push-pull output which emulates push-pull pentodes with a poorly regulated power supply. FIG. 12 is a combination of FIGS. 10 and 11 of a preceding application, now U.S. Pat. No. 5,434,536.

The components 191 through 199 is an approximation to the phase splitter for a bipolar amplifier which requires both inputs in-phase. Since the two triodes in a differential amplifier phase splitter compensate each other, the stage produces very little distortion until clipping. The output resistance of the phase splitter is about twice the triode plate resistance normally, but becomes nearly infinite when clipping.

When the output of amplifier 191 goes high, network 192 pulls up voltage at 193. When the voltage at 193 approaches the plate voltage P, network 194 becomes more resistive and disconnects when the voltage at 193 is greater than the voltage at P. At the same time, network 195 disconnects and the current from source 196 flows through network 197 to plate N. Symmetric behavior occurs when the amplifier 191 output goes negative: network 192 disconnects, P has current from current source 198, network 195 pulls down voltage at 199, and network 197 disconnects from plate N. The networks 192, 194, 195, and 197 use an extra diode in series with the input to keep reverse currents from flowing.

The components 191–199 of FIG. 12 provides the soft cutoff for the grid circuit of the output stage. Since the negative half of the output stage operates symmetrically to the positive half, only the positive (upper) half will be detailed. As shown, the lower half operates in phase with the non-linearities in the opposite direction. Resistor 202 is the plate resistor for the input circuit. Capacitor 203 is the coupling capacitor. Diodes 204 and 205 emulate positive grid conduction. Zener diode 205 adjusts for the nominal zero bias of this stage. Resistor 206 is the grid resistor which drives amplifier 208 with feedback resistor 207. Network 209 is nominally a squaring, second order emulation of the pentode transfer characteristic. This gain varying characteristic provides smooth crossover and the variable gain for emulating tube compression. Amplifier 211, shown as a transistor, shifts the level of the signal to the output supply voltage +40 with the help of resistor 212. MOSFET 213 with source resistor transfers the voltage on resistor 212 to a current through resistor 214. Bias resistor 210 is adjusted to overcome the threshold voltage of MOSFET 213. The remaining bias is established by the voltage on the base of transistor 211. Zener diode 215 allows the load to fly back some before it is clamped.

The components 203–206 form a bias shifter. The diodes correspond to the grid conduction of tubes. The capacitor 203 corresponds to their coupling capacitors. And resistor 206 corresponds to their grid resistors.

Inverting amplifier 220 and non-linear networks 221 and 222 feedback the output to emulate the plate resistance of a pentode. Notice that the feedback loop goes through both non-linear networks. Consequently, the plate resistance and the transfer characteristics are functions of both the output and the input. This is seen in the different slopes of pentode plate curves.

The saturation region is emulated by resistor 214. Again, the entire characteristic is not perfect, but around the load line it is a good approximation.

The poor regulation of the power supply coupled with screen grid operation creates the compression found in tube amplifiers. When the power supply sages under the load of large signals, the screen voltage goes down in a manner dictated by the power supply filter. The drop in screen voltage lowers the output current and lowers the gain of the tube.

The screen grid voltage shift can be lumped into a control grid shift according to Thomas Martin in his book *Electronic Circuits,* Prentice-Hall, pages 84–87 providing the signal is scaled appropriately.

Although the power supply could drive this circuit, it is simpler to estimate the power current with filter 230. The resulting signal is rectified by 231 and then filtered by 232 which has the same time constants and overshoot as the emulated power supply. The output of 232 is fed to the negative half by resistor 235 while being inverted by 233 and fed to the positive half by resistor 234. An increasing output then reduces the bias on networks 209 and 236 reduces the output currents, increases the resistance of these networks and lowers the gain. The compression control signal from the output of filter 232 is canceled in the output.

The speaker 218 is preferably the fat enhanced speaker of FIG. 2 which provides the desired intermodulation distortion whether the amplifier is clipping or not.

THE VARIABLE RESISTANCE EMBODIMENT

There are several candidates for the variable resistance embodiment, the light dependent resistor, the field effect transistor, and a non-linear device or network. The light dependent resistor is used by the sub-sonic tremolo circuit, and would work in the present invention if capable of the speed. The field effect transistor is known for its variable resistance region, its only problem with the field effect transistor is its production variability. However, adequate selection can produce a suitable non-linear means.

FIG. 13 shows a non-linear device embodiment that uses the variability of the dynamic resistance to create intermodulation. Amplifier 250 and non-linear network 251 is representative of a triode tube emulator driving stage having plate resistor 252. The signal on the plate is coupled by capacitor 253 and biased by resistor 254 to the phase splitter transistor 255. Transistor 255 is representative of a cathodyne phase splitter or its emulator and has load resistors 256 and 257. The two phases are coupled with capacitors 260 and 261 to the grid terminals of two triode emulators. The grid conduction is created by diodes 262 and 263 and conduction offset means 264. The grid resistors 266 and 267 are also the input resistors for inverting amplifiers 268 and 269 that have gain setting feedback resistors 270 and 271. The inverting amplifiers are coupled to an output transformer 274 by non-linear networks 272 and 273. The center tap of the output transformer is powered by a relatively poor power supply 275, such as FIG. 5 that has a desirable amount of ripple. Alternatively, one could also use the circuits of FIGS. 6 or 7 providing they were properly biased at approximately half the positive supply voltage.

The ripple signal from source 275 interacts with non-linear networks 272 and 273 to produce opposing currents in the transformer which cancel to a degree determined by the equivalence of the resistance of the non-linear networks 272 and 273. When the input signal causes the networks to have unequal resistances, the ripple signals in the transformer are not equal and consequently produces an output. Since the resistance difference and consequently the ripple signal output is determined by the signal, the ripple signal output is the intermodulation products of the input and the ripple signal.

This approach does not work in typical solid state for many reasons: 1) the typical transistor has a very high output resistance, 2) the output resistance is made higher with emitter resistors, 3) the typical output stage is an emitter or drain follower, 4) the amplifier uses substantial feedback, or 5) the power supply has very little ripple. Tube amplifiers, particularly triodes, have a lower output resistance, typically do not have cathode degeneration, typically are not cathode followers, do not use nearly as much feedback, and have sizeable ripple in the power supplies. By experimentation, this and/or screen grid influences produce the tube embellishment.

FIG. 13 also shows a second input to amplifiers 268 and 269 via resistors 280 and 281 from a limited upper spectrum source or filter 282. While 275 alters the transformer side voltages of the non-linear networks, 282 alters the amplifier side voltages. The results are the same until the amplifiers clip where the variation from 275 continues while the embellishments from 282 are periodically interrupted by the clipping behavior.

Notice that this form is the same required to enhance any non-linear push-pull amplifier, including tube amplifiers. Notice further, that this is quite similar to the network 241–245 used to enhance a complementary, non-linear push-pull amplifier.

THE COMPUTER EMBODIMENT

Figure 15:
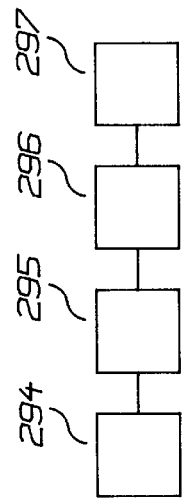
FIG. 15 is a computer program flow chart.
Figure 14:
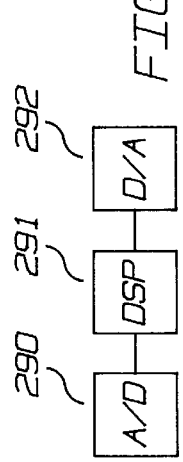
FIG. 14 is a block diagram of a digital embodiment.

FIGS. 14 and 15 address the ever growing digitalization of the world including audio. FIG. 14 shows an analog-to-digital converter 290 providing digital signals to a computer or digital signal processor 291. The computer provides digital signals to a digital-to-analog converter 292. The input is sampled periodically, converted to digital, operated upon by the computer, and converted back to digital. Since the same program is executed by the computer for each sample, it is only necessary to indicate the processing for a single sample.

The well-known arts for storing and transmitting digital data may remove the converters from direct connection to said computer.

FIG. 15 shows a flow chart for the single sample programming. The program starts at 294, computes the low-frequency signal in 295, performs the non-linear mathematics in 296, and returns program control in 297.

The low frequency signal may be computed in 295 by techniques within the digital arts. It may be a filtered version of the input or the output or is a digitally created signal. A digitally created signal, particularly a saw-tooth is simply created by incrementing a value V with a value INC at each sample time in Fortran:

$$V=V+INC$$

The natural overflow will make V appear as the desired saw-tooth. At this point the variable V may be as shown, the input value, or the output value. However, a saw-tooth has an infinite spectrum and the input or the output has too great a spectrum. Any of these needs to be limited with a filter. There are many digital filters. For simplicity, this is an infinite response type that uses the value F for a filter constant. LFF is the output of the filter and LFS is the value for the low-frequency source:

$$LFF=LFF+F*(V-LFF)$$

$$LFS=LFF+BIAS$$

This saw-tooth can be controlled in frequency by making INC a variable dependent upon the absolute value of the output of a digital filter. The digital filter responds to either the input or the output.

The programming for step 296 is also quite simple:

$$OUTPUT=INPUT*LFS$$

Please note that mathematics is often distributive and this value is equivalent to which unfortunately has a quite different description. This situation is like the effect of resistor 23 in FIG. 3.

$$OUTPUT=INPUT*BIAS+INPUT*LFF$$

This concept may be generalized to the circuitry within by applying well-known circuit analysis techniques to the figures within. This disclosure shows circuitry whose operational characteristics are well-known and readily translated to digital programming since their functions are within the digital processing arts.

LESS LOW-FREQUENCY SIGNAL

The operation of the non-linear means and the low-frequency signal means with the D.C. bias produces the input signal and intermodulation products of the input and the low-frequency signal. However, the little or no D.C. bias on the input and nearly perfect operation of a multiplier means produces little or no low-frequency signal at the output. The gain of the low-frequency is substantially smaller than the gain of the input signal, hence there is less low-frequency signal than input signal in the output.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An audio amplifier system improved by an intermodulation distortion enhancement means having an audio input and an audio output for producing an audio signal enhanced by intermodulation products comprising:

a limited upper frequency audio spectrum source for producing a limited upper frequency audio signal having a minus 3 db high frequency roll-off point at or above 50 Hz or a resonant frequency at or above 50 Hertz which is either an independent source or a rectifier-less filter means deriving its input from said amplifier; and a non-thermionic non-linear means responsive to said audio input and said limited upper frequency signal for producing an output signal which includes, whether clipping or not clipping, signal components of the input signal and intermodulation products of said input and limited upper spectrum audio signals and comparatively little or no limited upper spectrum audio signal.

2. The solid state amplifier and intermodulation distortion means of claim 1 wherein said amplifier means includes at least one of the following tube emulation means:

an amplifier means and non-linear means for the emulation of a triode vacuum tube;

an amplifier means and non-linear means for the emulation of a pentode vacuum tube;

a means for emulating compression effects of a vacuum tube amplifier in response to its power supply under load;

means for producing a non-constant output impedance; or means for producing harmonics without clipping.

3. The solid state amplifier of claim 1 wherein said intermodulation distortion means is a speaker means having a voice coil connected to the output of said amplifier, and a field coil mechanically separate from said voice coil, said field coil being part of said limited upper spectrum means, wherein said nonlinear means is the relationship between the magnetic field produced by said field coil and the signal in said voice coil.

4. The solid state amplifier and speaker of claim 3 wherein said speaker includes compression means.

5. The solid state amplifier of claim 1 wherein said limited upper frequency spectrum source includes a filter responsive to the output of said amplifier.

6. The solid state amplifier of claim 1 wherein said limited upper frequency spectrum source includes a filter responsive to an amplifier signal.

7. The solid state amplifier of claim 1 wherein said limited upper frequency spectrum source includes a power supply having ripple, and the output of said source is responsive to said ripple.

8. The solid state amplifier of claim 1 wherein said limited upper frequency spectrum source includes a random noise generator.

9. The solid state amplifier of claim 8 wherein the spectrum of said random noise generator is controlled by an amplifier signal.

10. The solid state amplifier of claim 1 wherein said limited upper frequency spectrum source includes an oscillator.

11. The solid state amplifier of claim 10 wherein said oscillator produces a saw-tooth waveform.

12. The solid state amplifier of claim 10 wherein the frequency of said oscillator is controlled by an amplifier signal.

13. The solid state amplifier of claim 10 wherein said oscillator produces a frequency in the 100 to 200 Hertz range.

14. The solid state amplifier of claim 1 wherein said non-linear means includes a variable gain amplifier.

15. The solid state amplifier of claim 1 for an amplifier wherein said non-linear means is a non-linear transconductance means.

16. The solid state amplifier of claim 14 wherein said non-linear means produces a current approximately proportional to the square of the voltage across said non-linear means.

17. The solid state amplifier of claim 14 wherein said non-linear means includes series diodes and parallel resistors connected in a ladder.

18. The solid state amplifier of claim 14 wherein said non-linear means includes series connected pairs of a parallel resistor and diode.

19. The solid state amplifier of claim 14 wherein said non-linear means uses the logarithmic and exponential characteristics of semiconductor junctions to produce a non-linear relationship between the voltage across said non-linear means to the current flowing through said non-linear means.

20. The solid state amplifier of claim 1 wherein said non-linear means is responsive to said input via a filter which removes bass frequencies so that level of harmonics of the input in the output is reduced.

21. The intermodulation means of claim 1 wherein signals are digital values and said amplifier means, source means, and non-linear means are programs operating in a digital computer.

22. A solid state intermodulation distortion enhancement means for creating an enhanced audio signal and having an input and an output comprising:
low audio frequency rectifier-less low-pass filter having a minus 3 db point at or above 50 Hertz or band-pass filter means having center frequency at or above 50 Hertz for passing at least one of said input or said output signals as a filter signal;
non-linear means responsive to said input and filter signals for producing an output signal which includes, whether clipping or not clipping, signal components of the input signal and intermodulation products of said input and filter signals and comparatively little or no filter signal.

23. The intermodulation means of claim 22 for an amplifier wherein said non-linear means is a non-linear transconductance means.

24. The intermodulation means of claim 23 wherein said non-linear means produces a current approximately proportional to the square of the voltage across said non-linear means.

25. The intermodulation means of claim 23 wherein said non-linear means includes series diodes and parallel resistors connected in a ladder.

26. The intermodulation means of claim 23 wherein said non-linear means includes series connected pairs of a parallel resistor and diode.

27. The intermodulation means of claim 23 wherein said non-linear means uses the logarithmic and exponential characteristics of semiconductor junctions to produce a non-linear relationship between the voltage across said non-linear means to the current flowing through said non-linear means.

28. The intermodulation means of claim 22 wherein said non-linear means uses a transconductance amplifier having a gain control input responsive to said filter.

29. The intermodulation means of claim 22 including non-linear feedback means responsive to said output for producing a non-linear feedback signal wherein said non-linear means is also responsive to a non-linear feedback signal.

30. The intermodulation means of claim 29 wherein said non-linear feedback means emulates the filter behavior of the screen grid power supply of a vacuum tube amplifier.

31. The intermodulation means of claim 22 wherein said non-linear means is a variable resistance means.

32. The intermodulation means of claim 22 wherein said low-frequency filter is an underdamped low-pass filter.

33. The intermodulation means of claim 22 wherein said low-frequency filter resonates at a speaker resonant frequency.

34. The intermodulation means of claim 22 including a low-pass filter means responsive connected between said non-linear means and said output.

35. The intermodulation means of claim 22 wherein said signals are digital values and said filter means and non-linear means are programs operating in a digital computer.

36. The intermodulation means of claim 22 for a speaker having voice coil connected to said input, permanent magnet operable over the range of operation of said speaker, and field winding mechanically separate from said voice coil wherein at least said field winding is said filter connected to said input and wherein said non-linear means is the interaction of said field winding and said voice coil.

37. The intermodulation means of claim 36 wherein said filter means includes compressor means.

38. The intermodulation means of claim 22 wherein said filter means includes compressor means.

39. The intermodulation means of claim 22 wherein said non-linear means is responsive to said input via a filter which removes bass frequencies so that level of harmonics of the input in the output is reduced.

40. The intermodulation means of claim 22 including bias supply for biasing the signal produced by said filter means.

41. The intermodulation means of claim 40 wherein said bias supply includes a ripple signal.

42. The intermodulation means of claim 22 wherein said filter means includes oscillator means.

43. A modulation means for a speaker for enhancing the output of said speaker and having input terminals, a voice coil and a permanent magnetic structure having a permanent magnet operable over the operating range of said speaker including:

a field winding means mechanically separate from said voice coil for altering the magnetic field of said permanent magnetic structure, said field winding being part of or forming a rectifier-less filter having a minus 3 db high frequency roll off point at a frequency greater than 50 Hertz; so that the sound from said speaker includes components from the interaction said voice coil and said permanent magnet and the intermodulation distortion components from the interaction of the voice coil and said field winding as energized from said input terminals; wherein the sounds produced by said field coil are comparatively less than the sounds produced by said voice coil.

44. The modulation means of claim 43 including means for compressing the signal connecting said field winding to said voice coil.

45. The modulation means of claim 44 wherein said compressing means is a lamp.

46. The modulation means of claim 43 wherein said voice coil is connected to said input by a filter means which removes bass frequencies.

47. The modulation means of claim 43 wherein said field coil has a D.C. resistance greater than the D.C. resistance of said voice coil.

48. A modulation means for a speaker for enhancing the output of said speaker and having input terminals, a voice coil and a permanent magnetic structure including a field winding means mechanically separate from said voice coil for altering the magnetic field of said permanent magnetic structure, said field winding being part of or forming a rectifier-less filter having a minus 3 db high frequency roll off point at a frequency greater than 50 Hertz so that said voice coil so that the sound from said speaker includes components from the interaction said voice coil and said permanent magnet and the intermodulation distortion components from the interaction of the voice coil and said field winding as energized from said input terminals; and compression means connecting said voice coil to said filter for compressing said field winding signal.

49. The modulation means of claim 48 wherein said compressing means is a lamp.

50. The modulation means of claim 48 wherein said voice coil is connected to said input by a filter means which removes bass frequencies.

51. Intermodulation distortion enhancement means for a push-pull amplifier having an input and an output and a plurality of output means having inputs for producing said output including limited upper frequency spectrum audio source having a minus 3 db high frequency roll off point at or above 50 Hertz; and connection means for connecting said limited upper frequency spectrum source to said inputs of said plurality of output means so that the limited upper frequency audio source is at least partially canceled by said output means.

52. The enhancement means of claim 51 wherein said push-pull amplifier output means operate in phase and said connection means includes inverter means for connecting said audio source to at least one of said output means.

53. The enhancement means of claim 51 wherein said push-pull amplifier output means operate out-of-phase and said connection means connects said audio source to said output means inputs in phase.

54. The enhancement means of claim 51 wherein said limited upper frequency spectrum audio source includes an oscillator means.

55. The enhancement means of claim 54 wherein said oscillator produces a frequency in the 100 to 300 Hertz range.

56. The enhancement means of claim 51 wherein said limited upper frequency spectrum audio source includes a full wave power supply having a ripple in excess of 1 percent, and the output of said source is responsive to said ripple.

* * * * *